(12) United States Patent
Yu

(10) Patent No.: US 9,349,932 B2
(45) Date of Patent: May 24, 2016

(54) FLEXIBLE LIGHTING ASSEMBLY, A LUMINAIRE, AND A METHOD OF MANUFACTURING A FLEXIBLE LAYER

(75) Inventor: Jianghong Yu, Best (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 64 days.

(21) Appl. No.: 14/240,107

(22) PCT Filed: Aug. 20, 2012

(86) PCT No.: PCT/IB2012/054205
§ 371 (c)(1),
(2), (4) Date: Feb. 21, 2014

(87) PCT Pub. No.: WO2013/030714
PCT Pub. Date: Mar. 7, 2013

(65) Prior Publication Data
US 2014/0209967 A1   Jul. 31, 2014

Related U.S. Application Data

(60) Provisional application No. 61/528,807, filed on Aug. 30, 2011.

(51) Int. Cl.
*H01L 33/64* (2010.01)
*H05K 1/03* (2006.01)
*H05K 1/18* (2006.01)

(52) U.S. Cl.
CPC ............ *H01L 33/641* (2013.01); *H05K 1/0373* (2013.01); *H05K 1/0393* (2013.01); *H05K 1/189* (2013.01); *H01L 2224/48091* (2013.01); *H05K 2201/0162* (2013.01); *H05K 2201/0209* (2013.01); *H05K 2201/10106* (2013.01); *H05K 2201/10272* (2013.01); *H05K 2201/10287* (2013.01)

(58) Field of Classification Search
CPC ............................ H01L 33/644; H01L 33/641
See application file for complete search history.

(56) References Cited

U.S. PATENT DOCUMENTS

| | | | |
|---|---|---|---|
| 4,810,563 A | 3/1989 | DeGree et al. | |
| 5,900,447 A | 5/1999 | Ishida | |
| 6,162,849 A | 12/2000 | Zhuo et al. | |
| 6,652,958 B2* | 11/2003 | Tobita | C08K 9/02 257/E23.107 |
| 6,831,031 B2* | 12/2004 | Ishihara | H01L 23/15 174/137 B |
| 7,710,045 B2 | 5/2010 | Schultz et al. | |
| 8,203,669 B2* | 6/2012 | Kondo | G02B 6/0085 349/161 |
| 2005/0101719 A1* | 5/2005 | Ishihara | 524/495 |
| 2007/0148467 A1 | 6/2007 | St. Lawrence | |
| 2008/0057333 A1 | 3/2008 | Chu et al. | |
| 2008/0074871 A1 | 3/2008 | Meis et al. | |

(Continued)

FOREIGN PATENT DOCUMENTS

| | | |
|---|---|---|
| EP | 1473328 A1 | 11/2004 |
| WO | 0163985 A2 | 8/2001 |

(Continued)

*Primary Examiner* — Evan Pert

(57) ABSTRACT

A flexible lighting assembly 100, a luminaire, a method of manufacturing a flexible layer 102 and a use of the flexible layer 102 is provided. The flexible lighting assembly 100 comprises a flexible layer 102 of a flexible polymer and comprises a
C light source 108 which is thermally coupled to the flexible layer 102. The flexible layer 102 comprises boron nitride particles 106 that have a hexagonal crystal structure.

11 Claims, 6 Drawing Sheets

(56) References Cited

U.S. PATENT DOCUMENTS

2009/0273925 A1 11/2009 Schultz et al.
2014/0369045 A1* 12/2014 Yu et al. .................. 362/249.02

FOREIGN PATENT DOCUMENTS

WO 2006001663 A1 1/2006
WO 2007089599 A2 8/2007

* cited by examiner

FLEXIBLE LIGHTING ASSEMBLY, A LUMINAIRE, AND A METHOD OF MANUFACTURING A FLEXIBLE LAYER

FIELD OF THE INVENTION

The invention relates to flexible lighting assemblies.

BACKGROUND OF THE INVENTION

In known LED encapsulating materials, the thermal conductivity of the material is too often low to obtain an effective cooling of the LED is not provided. Materials, which provide an effective cooling of the LED, are in general not flexible enough for obtaining a flexible lighting assembly which may be provided to a curved profile. Another set of known materials comprises electrically conductive particles for enhancing the thermal conductivity, however, such electrically conductive particles have the risk of causing short-circuits between the wires which provide power to the LED.

Published patent application U.S. 2009/0273925 discloses a LED illumination assembly with a compliant foil construction. The assembly comprises Light Emitting Diodes (LEDs) which are provided on a stack of layers. In this paragraph it is assumed that the layer on which the LEDs are provided is defined as the top layer of the stack of layers. The top layer comprises metal wires, which provide, for example, power to the LEDs. Directly below the top layer is provided a polymeric layer which comprises particles for enhancing the thermal conductivity of the polymeric layer. A disclosed example of the particles is boron nitride. Preferably the polymeric layer is electrically insulating and has a relatively good thermal conductivity to provide heat generated by the LEDs to other layers below the polymeric layer. In specific embodiments the LEDs are in direct contact with the metal wires via which the heat of the LED is provided to the polymeric layer. In other embodiments a specific surface of the LEDs is also in contact with the polymeric layer.

Although the polymeric layer with boron nitride particles provides to some degree a cooling effect to the LED, the polymeric layer does not provide the thermal characteristics which are required to have an effective cooling of the LED. For, example, in a flexible lighting assembly in which LEDs and power wires of the LEDs are (partly) encapsulated, better thermal characteristics are desired to prevent to prevent too high LED temperatures.

SUMMARY OF THE INVENTION

It is an object of the invention to provide a flexible lighting assembly which conducts a relatively large amount of heat away from the light source.

A first aspect of the invention provides flexible lighting assembly as claimed in claim 1. A second aspect of the invention provides a luminaire as claimed in claim 11. A third aspect of the invention provides use of a flexible layer of a flexible polymer as a heat sink for a light source as claimed in claim 12. A fourth aspect of the invention provides a method of manufacturing a flexible layer as claimed in claim 13. Advantageous embodiments are defined in the dependent claims.

A flexible lighting assembly in accordance with the first aspect of the invention comprises a flexible layer of a flexible polymer and comprises a light source which is thermally coupled to the flexible layer. The flexible layer comprises boron nitride particles that have a hexagonal crystal structure.

The thermal characteristic of the boron nitride particles that have the hexagonal crystal structure is an orthotropic thermal characteristic which means in the specific case of the boron nitride particles that the thermal conductivity of the boron nitride particles is in a direction along a specific plane relatively high, while in a direction perpendicular to the specific plane the thermal conductively is relatively low. If such boron nitride particles are used in a layer of a flexible polymer, the thermal conductivity of the flexible layer as a whole is also orthotropic: in directions which follow the flexible layer, heat is conducted relatively well, while the heat conductivity in a direction perpendicular to the flexible layer is lower. This is advantageous because the heat needs to be conducted away from the light source via the flexible layer, and, thus, a good thermal conductivity in the direction of the flexible layer is required. Moreover, conductive heat is spread over a surface of the flexible layer which allows a better heat transfer to the ambient via the radiation of heat at the surface. Thus, the light source is effectively cooled and the temperature of the light source remains within acceptable limits. A light source temperature within acceptable limits has several advantages, such as a longer life time for the light source and less mechanical stress in the light source and materials very close to the light source.

Without the boron nitride particles, the flexible layer would act as a thermal isolator in the directions of the flexible layer, because flexible polymers have a low thermal conductivity. The fact that the thermal conductivity in the direction perpendicular to the flexible layer is lower is not disadvantageous in the specific application of the flexible lighting assembly. The thickness of the flexible layer, measured in the direction perpendicular to the flexible layer, is relatively small, and, thus, the flexible layer does not act as a thermal isolator in the direction perpendicular to the flexible layer.

A further advantage is that the boron nitride is not electrically conductive and, thus, no risk for short-circuiting exists. Additionally, boron nitride has a low coefficient of temperature expansion (CTE), which means that, if boron nitride particles become warmer, their size does almost not increase. Further, boron nitride ages very slowly and, thus, during the lifetime of the flexible lighting assembly characteristics of the boron nitrides remain substantially equal.

In the flexible lighting assembly, some light emitted by the light source may impinge on the flexible layer. The boron nitride particles act also as diffusely reflective particles and, consequently, the flexible layer diffusely reflects light the impinging light. Thus, the flexible layer increases the optical efficiency of the flexible lighting assembly because of the diffuse reflections.

A thermal coupling between the light source and the flexible layer may be obtained by arranging the light source in direct contact with the flexible layer. The direct contact may be partial, which means that the light source is, for example, partial encapsulated by the flexible layer. Further, the thermal coupling may also be obtained when the light source is only separated from the flexible layer by a thin layer, or a thermally conductive layer. The light source may, for example, be coupled to the flexible layer by a glue and the thin layer of glue will conduct a relatively large amount of heat generated within the light source.

Optionally, the flexible polymer is a silicone rubber. Silicone rubbers provide enough flexibility and can be easily processed into the flexible layer. They also allow the dispersion of the boron nitride particles in the flexible layer such an advantageous flexible layer with a high enough thermal conductivity in the direction of the flexible layer is obtained. Silicone rubber has in general a low thermal conductivity and the boron nitride particles are used to increase the thermal conductivity of the Silicone rubber.

Optionally, the silicone rubber is polydimethylsiloxane (PDMS). PDMS is a silicone rubber which has specific characteristics which are advantageously in the context of the invention. PDMS is transparent, which allows the full use of the diffusely reflectivity of the boron nitride particles. Further, PDMA has an advantageous flexibility which allows the creation of the flexible lighting assembly which can be shaped very well without losing it typical characteristics. For example, the flexible layer does not break and no micro cracks appear in the flexible layer and, as such, the thermal conductivity remains high enough, also when the flexible layer is shaped. Further, PDMS ages very slowly, which means that after a relatively long period only minor changes to the characteristics of the material may be detected. The aging of PDMS is not accelerated when the PDMS material becomes relatively warm, which is advantageously for the flexible lighting assembly.

Optionally, the boron nitride particles have a size in a range from 3 to 6 micrometer. In experiments it has been proved that boron nitride particles having a size in the specified range result in a good thermal conductivity of the flexible layer. Optionally, the boron nitride particles have a size in a range from 4 to 5.5 micrometer. Optionally, the boron nitride particles have a size of about 5 micrometer.

Optionally, a weight percentage of the boron nitride particles as a percentage of the weight of the flexible layer is in a range from 25 to 45 wt %. It has been proven that, if the weight percentage is above 25 wt %, the advantageous effect of a better thermal conductivity is relatively stronger than at weight percentage below 25 wt %. Further, at too low weight percentages the reflectively of the flexible layer is not high enough to be advantageous. At weight percentages above 45 wt %, the risk of micro-cracks in the flexible layer increases significantly and the micro-cracks limit the thermal conductivity of the flexible layers. Optionally, the weight percentage is in a range from 30 to 40 wt %. Optionally, the weight percentage of the boron nitride particles is about 40 wt % of the total mass of the flexible layer.

Optionally, the light source comprises wires which are electrically and thermally coupled to the light source, and the wires are thermally coupled to the flexible layer. In the embodiment the wires are also configured to conduct heat away from the light source and, because of the thermal coupling between the wires and the flexible layer, the heat can also be provided via the wires to the flexible layer such that a better cooling of the light source is obtained.

A thermal coupling between the wires and the flexible layer may be obtained by arranging the wires in direct contact with the flexible layer. The direct contact may be partial, which means that the wires are, for example, partial encapsulated by the flexible layer. Further, the thermal coupling may also be obtained when the wires are only separated from the flexible layer by a thin layer, or a thermally conductive layer. The wire may, for example, be coupled to the flexible layer by a glue and the thin layer of glue will conduct a relatively large amount of heat from the wires towards the flexible layer.

Optionally, the wires are encapsulated by the flexible layer. Optionally, the flexible layer comprises two sublayers and the wires are enclosed by the two sublayers.

Optionally, the flexible layer comprises a first sublayer comprising the boron nitride particles. The flexible layer further comprises a second transparent sublayer without boron nitride particles. The light source is provided within the two layers and at least thermally coupled to the first sublayer. The light source is arranged to emit light towards the second transparent sublayer. Thus, the second sublayer is meant as a light transmitting sublayer which outcouples the light towards the ambient, and the first sublayer is the heat transport layer which transports the heat away from the light source. It has been proven in an experiment that such a configuration keeps the temperature of the light source relatively low. A further advantageously effect of the first sublayer is that the first sublayer diffusely reflects light which is not directly emitted into the ambient and is directly transmitted from the light source to the first sublayer, or is indirectly transmitted to the first sublayer via total internal reflection in the second sublayer. At least a part of this diffusely reflected light is transmitted towards to a surface of the second sublayer which outcouples the light into the ambient.

Optionally, the light source is a laser or a light emitting diode. Such light sources generate a relatively large amount of light at a relatively small area and, as such, they can become relatively hot. Therefore, an effective cooling is required which is provided by the flexible layer.

Optionally, the flexible layer is arranged to reflect at least 95% of light in a wavelength range from 380 nm to 800 nm. In other words, if light in the wavelength range from 380 nm to 800 nm impinges on the flexible layer, at least 95% of the impinging light is reflected and, thus, not absorbed. The boron nitride particles reflect light, and they have, at least, a high reflectivity for light in the visible light spectral range. If the amount of boron nitride particles in the flexible layer is high enough almost all the impinging light is reflected, which is advantageous in situations wherein the light source also emits a portion of its emitted light towards the flexible layer because most of this light is reflected and not absorbed and thus the flexible lighting assembly is relatively efficient. The particle size of the boron nitride particles also influences the reflectivity. If the particle size is in the nanometer range very high reflectivity values can be obtained (for example, larger than 97%). It has been concluded in some tests that boron nitride particles may obtain a higher reflectivity than, for example, AlO and AlN particles. Further, the boron nitride particles reflect all wavelengths in the range from 380 nm to 800 nm at almost the same percentage and, as such, the boron nitride particles appear to be white, while some other material, like AlN particles, reflect a relatively low percentage of the lower wavelengths of the range from 380 nm to 800 nm and, thus, AlN particles have a color appearance.

Optionally, the weight percentage of boron nitride particles as percentage of the weight of the flexible layer is arranged to be larger than 20 wt % to obtain a light reflective layer having a reflectivity larger than 95%.

According to a second aspect of the invention, a luminaire is provided which comprises the flexible lighting assembly according to the first aspect of the invention. The luminaire according to the second aspect of the invention provides the same benefits as the flexible lighting assembly according to the first aspect of the invention and has similar embodiments with similar effects as the corresponding embodiments of the flexible lighting assembly.

According to a third aspect of the invention, a flexible layer of a flexible polymer is used as a heat sink for a light source. The flexible layer comprises boron nitride particles having a hexagonal crystal structure. The use of the flexible layers as a heat sink according to the third aspect of the invention provides the same benefits as the flexible lighting assembly according to the first aspect of the invention and has similar embodiments with similar effects as the corresponding embodiments of the flexible lighting assembly.

According to a fourth aspect of the invention, a method of manufacturing a flexible layer for use as a heat sink for a light source is provided. The method comprises the steps of: i) mixing a powder of boron nitride particles having a hexagonal crystal structure with a flexible polymer to obtain a mix, ii) creating a layer of the mix, and iii) curing the layer of the mix to obtain the flexible layer.

Optionally, the method further comprises the step of thermally coupling a light source to the flexible layer to obtain the flexible lighting assembly according to the first aspect of the invention.

These and other aspects of the invention are apparent from and will be elucidated with reference to the embodiments described hereinafter.

It will be appreciated by those skilled in the art that two or more of the above-mentioned options, implementations, and/or aspects of the invention may be combined in any way deemed useful.

Modifications and variations of the system, the method, and/or of the computer program product, which correspond to the described modifications and variations of the system, can be carried out by a person skilled in the art on the basis of the present description.

Figure 1A:
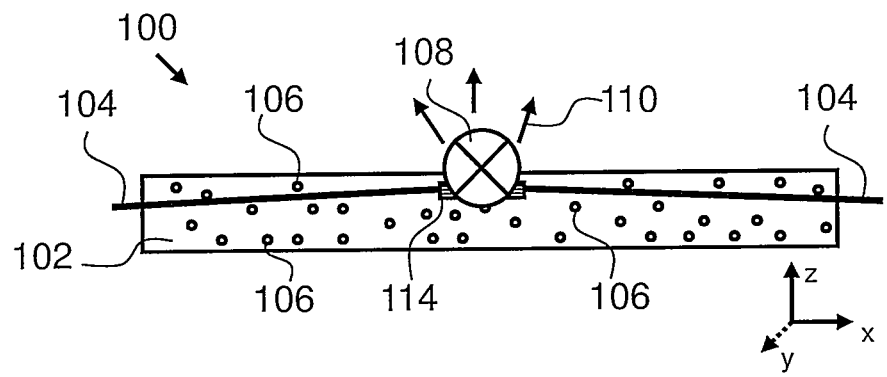
FIG. 1a schematically shows a cross-section of a flexible lighting assembly according to the first aspect of the invention, FIG. 1b schematically shows a cross-section of another embodiment of a flexible lighting assembly, FIG. 1c schematically shows a three-dimensional view off the flexible lighting assembly of FIG. 1b, FIG. 2 schematically shows a cross-section of a different embodiment of a flexible lighting assembly.

It should be noted that items denoted by the same reference numerals in different Figures have the same structural features and the same functions, or are the same signals. Where the function and/or structure of such an item have been explained, there is no necessity for repeated explanation thereof in the detailed description. The figures are purely diagrammatic and not drawn to scale. Particularly for clarity, some dimensions are exaggerated strongly

DETAILED DESCRIPTION

A first embodiment is shown in FIG. 1a. FIG. 1 a schematically shows a cross-section of a flexible lighting assembly 100 according to the first aspect of the invention. The flexible lighting assembly 100 comprises a light source 108 which emits, in operation, light 110. The light source 108 is coupled via two soldering joints 114 to two power wires 104.

The flexible lighting assembly further comprises a flexible layer 102 made of a flexible polymeric material. The flexible layer 102 comprises boron nitride particles 106. The boron nitride particles have a hexagonal crystal structure. The light source 108 is thermally coupled to the flexible layer 102, which means that heat is easily conducted from the light source 108 towards and into the flexible layer 102. In the embodiment of FIG. 1a, the light source 108 is partly in direct contact with the material of the flexible layer 102 and, as such, heat is easily conducted from the light source 108 to the flexible layer 102. Further, the solder joints 114 receive heat from the light source 108 and the wires 104 transport heat away from the light source 108. The wires 104 are encapsulated in the flexible layer 102 and, as such, heat is also provided via the wires 104 to the flexible layer 102.

The boron nitride particles 106 have a hexagonal crystal structure. Boron nitride particles 106 with a hexagonal crystal structure have a relatively high thermal conductivity along a plane and have a low thermal conductivity in the direction perpendicular to that plane. If such boron nitride particles 106 are used in the flexible layer 102, the thermal conductivity of the flexible layer 102 as a whole in the indicated x-direction and the indicated y-direction (which is a direction perpendicular to the presented cross-section) is relatively high, while the thermal conductivity of the flexible layer 102 in the indicated z-direction is relatively small. As the heat generated by the light source 108 needs to be conducted away from the light source 108, it is not disadvantageous that the thermal conductivity of the flexible layer 102 in the indicated z-direction is relatively low. The flexible layer 102 is relatively thin in the z-direction and as such the relatively low thermal conductivity of the flexible layer 102 in the z-direction does not limit the heat conduction away from the light source 108.

In FIG. 1a, the wires 104 are connected with solder joints 114 to the light source 108. In practice this means that the wires are, besides being electrically coupled to the light source 108, also thermally coupled to the light source 108. The wires 104 also conduct heat through the x-y-plane of the Figure and thus along the flexible layer 102. The wires 104 are embedded in the flexible layer 102 and, thus, also thermally coupled to the flexible layer 102. As such, the heat of the light source 108 is also provided via the wires 104 to parts of the flexible layer 102 which are located at a relative large distance away from the light source 108. This provides an addition effective heat conductive path for cooling the light source 108. Thus, the temperature of the light source 108 remains, in operation, within acceptable limits. Consequently, the lifetime of the light sources is increased and other problems, like mechanical stress as the result of too high temperature is prevented—the solder joints 114 are, for example, susceptible to mechanical stress.

It is to be noted that the embodiments discussed are not limited to one light source 108. In other embodiments, the flexible lighting assembly comprises a plurality of light sources and each one of the plurality of light sources is thermally coupled to the flexible layer.

Figure 1B:
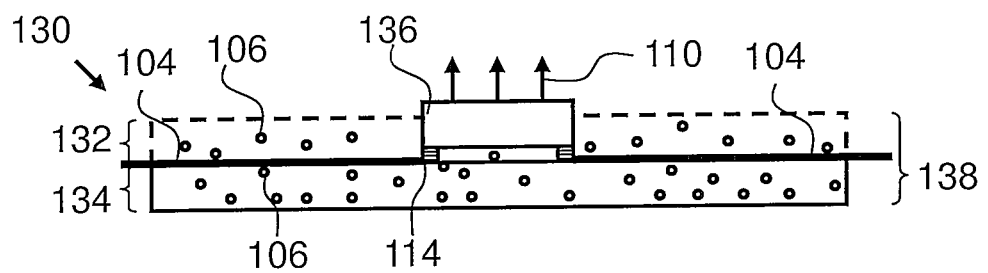
Figure 1C:
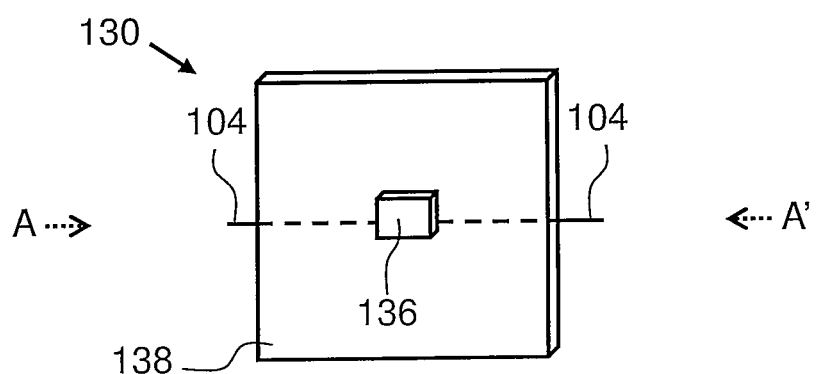

FIG. 1b schematically shows a cross-section of another embodiment of a flexible lighting assembly 130. In FIG. 1c schematically shows a three-dimensional view of the flexible lighting assembly 130. The cross-section of FIG. 1b is along a line between A and A' of FIG. 1c. The flexible lighting assembly 130 comprises a light emitting diode (LED) 136 which emits, in operation, light 110. The LED 136 is connected via solder joints 114 to power wires 104 which provide electrical power to the LED 136. The flexible lighting assembly 130 further comprises a flexible layer 138 which comprises a first and second flexible sublayer 132, 134. Both flexible sublayers 132, 134 are manufactured of a flexible silicone rubber (for example Sylgard® 184 Elastomer from Dow Corning) and comprise boron nitride particles which have a hexagonal crystal structure. The LED 136 is partly embedded in the first sublayer 132. The power wires 104 are arranged in between the first sublayer 132 and the second sublayer 134. Both sublayers 132, 134 are arranged in direct contact with each other and are as such thermally coupled to each other. It has been proven that the configuration of the flexible lighting assembly 130 provides effect cooling to the LED 136 via the flexible layer 138 in directions following the plane of the flexible layer 138 and via the power wires 104.

The amount of the boron nitride particles 106 within the flexible layer 138 may be expressed as a weight percentage (wt %) of the total weight of the flexible layer 138. The weight percentage of the boron nitride particles 106 as percentage of the weight of the flexible layer 138 is within 25 to 45 wt %. In another embodiment, the weight percentage of the boron nitride particles 106 as percentage of the weight of the flexible layer 138 is 40 wt %.

The boron nitride particles 106 have a certain size. The size is measured as an average diameter of the particle, which means that, all lines, which start at a point at a surface of the particles and end at another point at a surface of the particles and which also go through a center point of the particle, have an average length which is termed the particle size. In practical embodiments, the real average length of those lines of a specific particle may deviate within an uncertainty interval from the given particle size. The radius of the uncertainty interval is, for example, 25% of the particle size. The size of the boron nitride particles 106 which are embedded in the flexible layer 138 is in the range 3 to 6 micrometer. In another embodiment, the size is about 5 micrometer.

It is to be noted that the LED 136 is only partly enclosed by the first sublayer 132. However, in an alternative embodiments, the LED 136 is complete enclosed by the first sublayer and light is transmitted through a portion of the first sublayer 132. The boron nitride particles act also as a diffuser and, as such, in the alternative embodiment diffuse light is emitted.

It is further to be noted that, in FIG. 1b, the first sublayer 132 and the second sublayer 134 are neatly arranged on top of each other. In another embodiment, the first sublayer and the second sublayer are foils of a transparent flexible material which comprises boron nitride particles, the wires being arranged between the foils and in thermal contact with the foils, and the two foils being arranged on top of each other, however, the foils may be arranged on each other such that still some air gaps are in between the foils.

Figure 2:
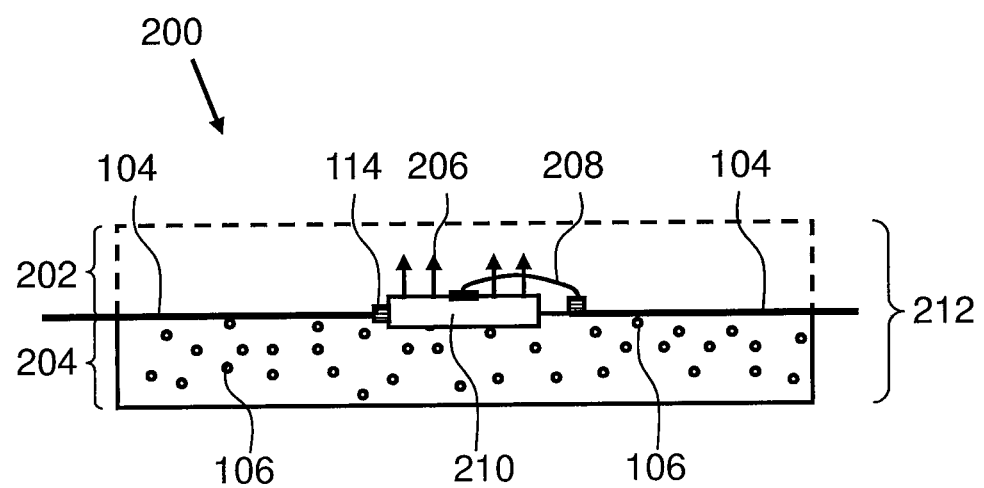

FIG. 2 schematically shows a cross-section of yet another embodiment of a flexible lighting assembly 200. The flexible lighting assembly 200 comprises a LED 210 which emits, in operation, light 206 at its light emitting surface. The LED 210 has one electrical connection for receiving electrical power at its light emitting surface and is, therefore, connected with a top-surface wire bond 208 to one of the power wires 104. The other power wire 104 is connected to another surface of the LED 210 with a solder joint 114. The flexible lighting assembly 200 further comprises a flexible layer 212 which comprises a first sublayer 202 and a second sublayer 204. The first sublayer 202 is of a flexible transparent material, such as, for example, polydimethylsiloxane (PDMS). The top surface wire-bond is encapsulated by the material of the first sublayer 202 (the material of the first sublayer 202 is, for example, dispensed on the second sublayer 204 and the LED before the material is being cured to a solid layer). The LED 210 emits, in operation, its light 206 into the flexible transparent material and the light 206 is emitted into the ambient of the flexible lighting assembly 200 at a surface of the first sublayer 202 which is opposite a surface where the light 206 is received by the first sublayer 202. The second sublayer 204 is made of PDMS and comprises boron nitride particles 106 which have a hexagonal crystal structure. The LED 210 is sandwiched in between the first sublayer 202 and the second sublayer 204. The power wires are also arranged in between the first sublayer 202 and the second sublayer 204. The LED 210 is at least thermally coupled to the second sublayer 204 such that the second sublayer 204 is able to conduct away heat from the LED 210 such that the temperature of the LED 210 remains within acceptable limits. An additional advantage of the embodiment of FIG. 2 is that the LED 210 is complete enclosed by flexible transparent material and, thus, protected against environmental influences, such as, for example, water. This advantage applies to all lighting assemblies which have the light source completely encapsulated by the flexible layer.

It is to be noted that the embodiment of FIG. 2 is not limited to LEDs of the top-surface wire bond type. Other type of LEDs as discussed in other embodiments, and other types of light sources may be used in the embodiment of FIG. 2 as well.

Figure 3:
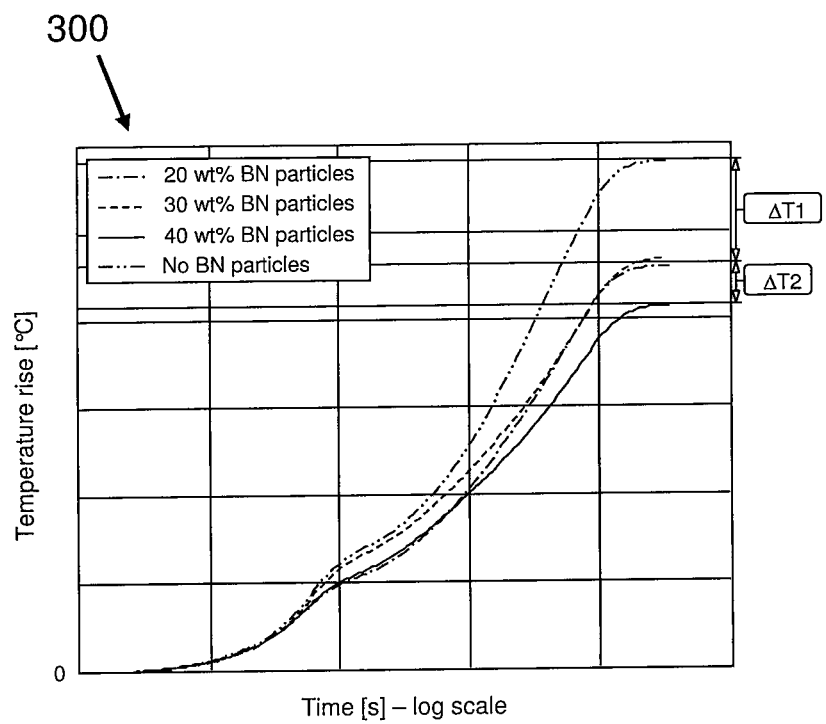
FIG. 3 shows a chart in which temperature measurements of LED junction temperatures of lighting assemblies having different flexible layers with different weight percentages of boron nitride, FIG. 4a schematically shows temperature gradients thermally and electrically coupled to a LED and thermally coupled to a flexible layer without boron nitride particles, FIG. 4b schematically shows temperature gradients of wires thermally and electrically coupled to a LED and thermally coupled to a flexible layer with boron nitride particles, FIG. 5 schematically presents a luminaire according to the second aspect of the invention, and FIG. 6 schematically presents a method of manufacturing a flexible layer for use as a heat sink for a light source according to the fourth aspect of the invention.

FIG. 3 shows a chart 300 with temperature measurements of a LED junction of LEDs of lighting assemblies having different flexible layers. The presented temperature measurements were taken from a flexible lighting assembly such as the one presented in FIG. 1a and the light source 108 was a Light Emitting Diode (LED). The MicRed T3Ster measurement system was used to measure the p-n junction temperature of the LED. Such a measurement is an in-suit measurement which does not require additional connections or sensors being applied to the LED.

The x-axis of the chart is a time-line in a log scale. At time t=0s power was provided to the LED and the temperature of the LED junction at t=0s is the reference value to which the temperature of the LED junction at later moments in time is compared. The y-axis presents the temperature rise of the LED junction compared to the temperature at t=0. The measurements were taken until the temperature did not rise anymore, in other words, until the junction temperature of the LED became a stable temperature.

For reference, a measurement was taken of a flexible lighting assembly with a flexible layer that did not contain any boron nitride particles. It is seen in the chart 300 that the LED junction temperature of such a flexible lighting assembly became relatively high.

Three lighting assemblies wherein the flexible layer comprises boron nitride particles were tested as well. The weight percentage (wt %) of the boron nitride particles as percentage of the total weight of the flexible layer is varied among the three lighting assemblies. It is seen in the chart 300 that the LED junction temperature of all three lighting assemblies does not rise to the same value as in the reference lighting assembly without boron nitride particles. Thus, the availability of the boron nitride particles reduces the LED junction temperature and, as such, the life time of the LED and also the solder junctions of the LED is increased. It is also seen that the difference in the cooling effect between 20 wt % and 30 wt % is small. However, at 40 wt % a substantial additional cooling is detected. Thus, at weight percentage above 30 wt % the cooling is relatively better.

Figure 4A:
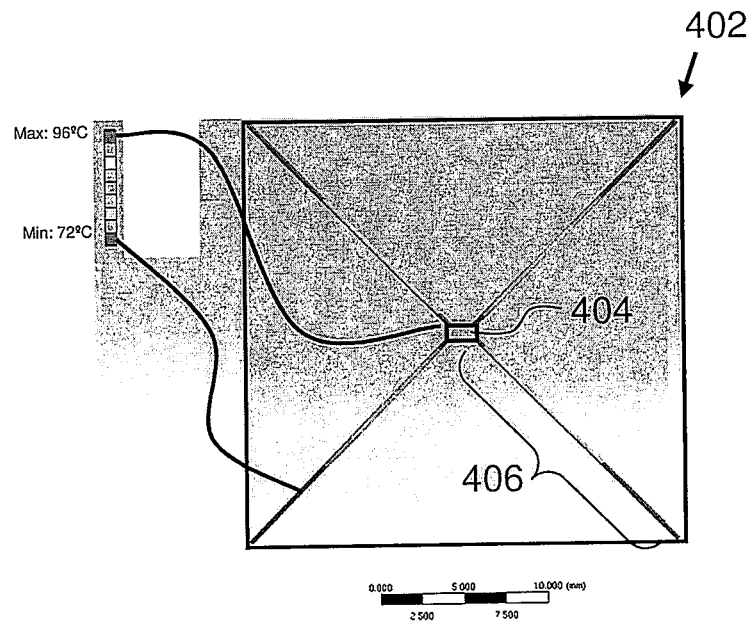

FIG. 4a schematically shows a temperature of wires connected to a LED which is thermally coupled to a flexible layer without boron nitride particles. The square at the right end of the figure represents the flexible lighting assembly 402. In the center is provided a LED 404 which is connected to four wires 406 which extend towards the corners of the flexible lighting assembly 402. The temperature of the wires 406 is measured. Very close to the LED 404 the temperature of the wire 406 is about 96 degrees Celsius, which means that the solder joint between the LED 404 and the wire 406 has about this temperature. Close to the corner of the flexible lighting assembly 402, the temperature of the wire 406 was about 72 degrees Celsius which is still relatively hot.

Figure 4B:
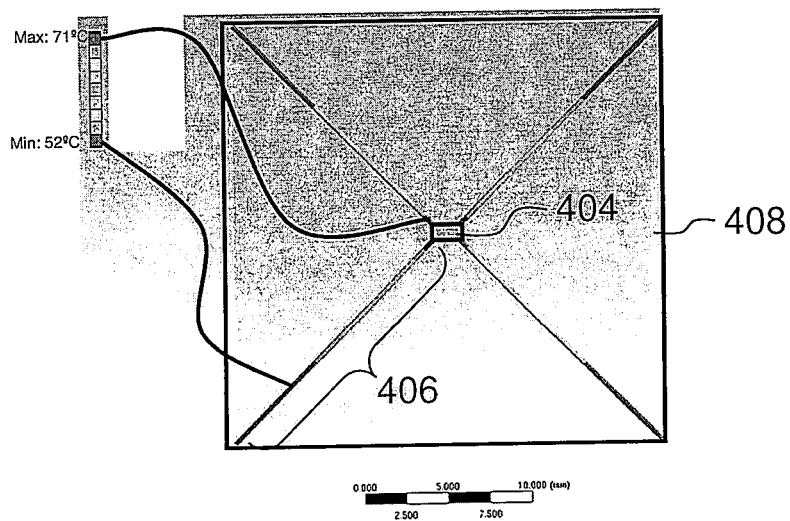

FIG. 4b schematically shows a temperature of wires 406 connected to a LED 404 which is thermally coupled to a flexible layer 408 with 40 wt % boron nitride particles.

The boron nitride have an orthotropic thermal conductivity, which means that their thermal conductivity is relatively large in the directions of a plane, and that their thermal conductivity is relatively low in a direction perpendicular to that plane. Typical thermal conductivity numbers for such boron nitride particles is 300-400 W/mK in directions along the plane, while the thermal conductivity in a direction perpendicular to that plane is 2 W/mK. It is seen in FIG. 4b that the temperature of the wires 406 close to the LED 404 is only 71 degrees Celsius and is about 52 degrees Celsius close to the corners of the flexible layer 408. Thus, the temperature of solder junction temperature is much lower compared to a flexible lighting assembly with a flexible layer which does comprise boron nitride particles.

The experiments of FIGS. 4a and 4b were also performed with a flexible lighting assembly which has a flexible layer with 40 wt % boron nitride particles which do not have the hexagonal crystal structure. The temperature of the wires close to the solder joints was about 75 degrees Celsius and about 53 degrees Celsius close to the corners of the flexible layer. Thus, a flexible layer which comprises boron nitride particles, which have a hexagonal crystal structure, provides a better cooling for the light source of the flexible lighting assembly.

Figure 5:
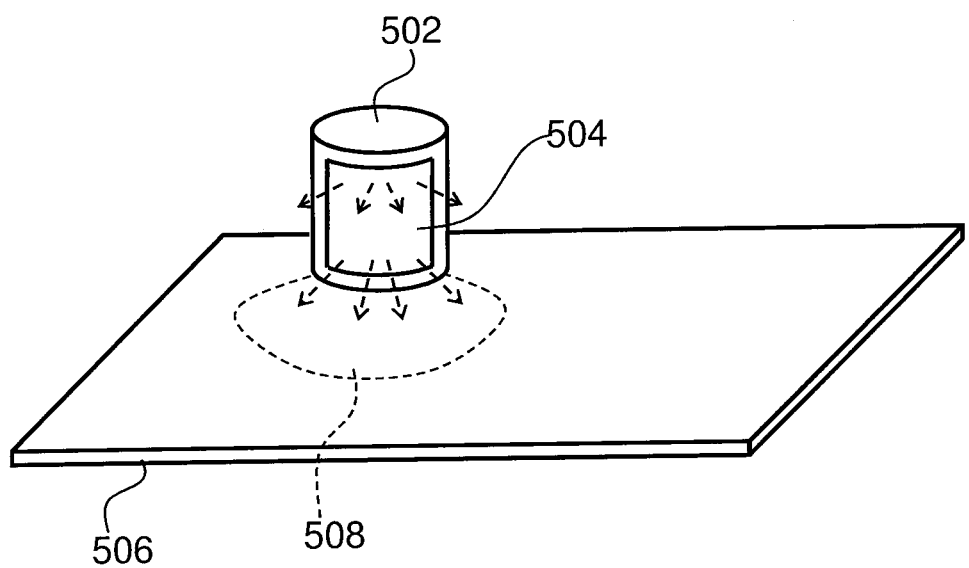

FIG. 5 schematically presents a luminaire 502 according to the second aspect of the invention. The luminaire 502 has a cylindrical shape and on a part of its curved surface a flexible lighting assembly 504 according to the first aspect of the invention is provided. In FIG. 5 the luminaire 502 is placed on a surface 506, for example, the surface of a table, and the light footprint 508 of the luminaire is indicated schematically.

Figure 6:
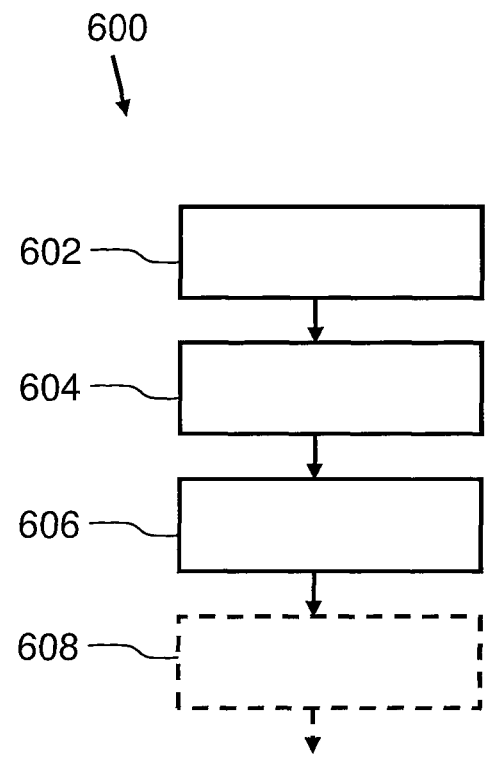

FIG. 6 schematically presents a method 600 of manufacturing a flexible layer for use as a heat sink according to the fourth aspect of the invention. The method 600 comprises the steps of: i) mixing 602 a powder of boron nitride particles having a hexagonal crystal structure with a flexible polymer to obtain a mix, ii) creating 604 a layer of the mix, and iii) curing 606 the layer of the mix to obtain the flexible layer. The curing 606 is, for example, performed in a low temperature oven or a vacuum. If the flexible polymer is PDMS the temperature of the low temperature oven is about 80 degrees Celsius and the curing takes about 1 hour. Optionally, in step 608, a light source is thermally coupled to the flexible layer, which means in another embodiment that the light source is brought in direct contact with the flexible layer.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements.

In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A flexible lighting assembly comprising:
a flexible layer comprising a flexible polymer; and
a light source being thermally coupled to the flexible layer, wherein the flexible layer comprises boron nitride particles having a hexagonal crystal structure and an orthotropic thermal conductivity.

2. A flexible lighting assembly according to claim 1, wherein the flexible polymer is a Silicone rubber.

3. A flexible lighting assembly according to claim 2, wherein the Silicone rubber is Polydimethylsiloxane.

4. A flexible lighting assembly according to claim 1, wherein the boron nitride particles have a size in a range from 3 micrometer to 6 micrometer.

5. A flexible lighting assembly according to claim 1, wherein a weight percentage of the boron nitride particles as a percentage of the weight of the flexible layer is in a range from 25 to 45 wt %.

6. A flexible lighting assembly according to claim 1, wherein the light source comprises wires being electrically and thermally coupled to the light source, and wherein the wires are thermally coupled to the flexible layer.

7. A flexible lighting assembly according to claim 6, wherein the wires are encapsulated by the flexible layer, or the flexible layer comprises two sublayers and the wires are enclosed by the two sublayers.

8. A flexible lighting assembly according to claim 1, wherein the flexible layer comprises a first sublayer comprising the boron nitride particles, the flexible layer comprises a second transparent sublayer without boron nitride particles, and the light source is provided within the first sublayer and the second sublayer and at least thermally coupled with the first sublayer, and the light source is arranged to emit light towards the second transparent sublayer.

9. A flexible lighting assembly according to claim 1, wherein the light source is a laser or a light emitting diode.

10. A flexible lighting assembly according to claim 1, wherein the flexible layer is arranged to reflect at least 95% of light in a wavelength range from 380nm to 800nm.

11. Luminaire comprising the flexible lighting assembly according to claim 1.

* * * * *